United States Patent
Na et al.

(10) Patent No.: US 6,246,636 B1
(45) Date of Patent: Jun. 12, 2001

(54) LOAD SIGNAL GENERATING CIRCUIT OF A PACKET COMMAND DRIVING TYPE MEMORY DEVICE

(75) Inventors: Kwang Jin Na; Jong Tae Kwak, both of Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/604,476

(22) Filed: Jun. 27, 2000

(30) Foreign Application Priority Data

Jun. 28, 1999 (KR) ................................. 99-24579

(51) Int. Cl.[7] ............................................. G11C 8/00
(52) U.S. Cl. ................................................ 365/233
(58) Field of Search .......................... 365/233, 189.05, 365/233.06

(56) References Cited

U.S. PATENT DOCUMENTS

| 5,418,753 | 5/1995 | Seki | 365/222 |
|---|---|---|---|
| 5,471,428 | 11/1995 | Baroni et al. | 365/210 |
| 5,703,821 | 12/1997 | Baroni et al. | 365/210 |
| 5,886,946 | 3/1999 | Ooishi | 365/233 |
| 6,088,291 | * 7/2000 | Fujioka et al. | 365/233 |
| 6,115,318 | * 9/2000 | Keeth | 365/233 |

FOREIGN PATENT DOCUMENTS

| 03088196 | 4/1991 | (JP) . |
|---|---|---|
| 04258886 | 9/1992 | (JP) . |
| 05036274 | 2/1993 | (JP) . |
| 07153275 | 6/1995 | (JP) . |
| 19392463 | 11/1998 | (JP) . |
| 10340596 | 12/1998 | (JP) . |

* cited by examiner

Primary Examiner—Trong Phan
(74) Attorney, Agent, or Firm—Pillsbury Winthrop LLP

(57) ABSTRACT

The present invention relates to a load signal generating circuit of a packet command driving type memory device, in a packet command driving type memory device for generating a load signal for loading data from a core block, a load signal generating circuit of a packet command driving type memory device of the present invention comprises a first signal generating means for receiving a first input signal and generating a first internal signal; a second signal generating means for receiving a second input signal and generating a second internal signal in response to a clock signal; a third signal generating means for receiving a third input signal and generating a third internal signal; a fourth signal generating means for receiving the first internal signal generated from the first signal generating means the second internal signal generated from the second signal generating means as two inputs, selecting and outputting the first internal signal according to the third input signal generated from the third signal generating means or selecting the second internal signal and generating a load signal synchronized to a clock signal.

13 Claims, 9 Drawing Sheets the case of tdac_en<3>='1' the case of tdac_en<4>='1' read data loadRDpipe_b
(In order that a dot line satisfies tDOH even in an operational state of an actual waveform of 300MHz)

tDOH=2.5ns(spec)

LOAD SIGNAL GENERATING CIRCUIT OF A PACKET COMMAND DRIVING TYPE MEMORY DEVICE

BACKGROUND OF THE INVENTION

1. Field of the Invention

The present invention relates to a load signal generating circuit of a packet command driving type memory device, particularly, to a load signal generating circuit for reading data for generating a load signal for transferring the data read from a core block to an output pad by synchronizing the load signal to a clock signal accurately.

2. Description of the Related Art

FIG. 1 indicates a channel structure in a general packet command driving type memory device, for example, a memory device such as RAMBUS DRAM. Referring to FIG. 1, a number of RAMBUS DRAMs are connected respectively on a longbus channel, a phase difference between CTM and CFM is different every RAMBUS DRAM. The more it is distant from a controller, the more the phase difference between CFM and CTM is large. A region that a phase difference increases from a spot of "0" to a spot of "1" is referred to as a latency domain.

In a case of the longbus channel, by that a device of the latency domain being far apart from a controller reads data quickly, that the device of the latency domain being near from a controller reads data slowly, a controller can recognize data in an identical point of time from every device.

FIGS. 2A–2C show read data according to a prior tdac_en signal and a waveform of a load signal loadRDpipe. Referring to FIG. 2A, in a case of tdac_en<3>=1, a signal loadRDpipe has a width of 1 cycle, but referring to FIG. 2B, in a case of tdac_en<4>=1, a signal loadRDpipe is delayed by 1 cycle than the case of tdac_en<3>=1. A RAMBUS DRAM can operate not only in 400 MHz (a period of 2.5 ns), but in 300 MHz (a period of 3.3 ns), when tdac_en<4>=1, a hold time $t_{doh}$ becomes 2.5 ns (=a width of 1 cycle in 400 MHz) accurately. If it is operated in 300 MHz, a width of read data is as it is, but as a width of a signal loadRDpipe_b is wider, the hold time $t_{doh}$ is shortened than 2.5 ns. That is, to maintain $t_{doh}$=2.5 ns even in 300 MHz, the signal loadRDpipe must become a pulse signal of ½ cycle.

However, in a case that a width of a prior load signal, a signal loadRDpipe has a width of ½ cycle, as a load signal is delayed and outputted through a three stage gate, delayed to the right on the whole as drawn in FIG. 2c, there was a problem that it doesn't satisfy a data hold time specified in spec in an operation of 300 MHz or 400 MHz in this case.

As described above, a hold time specified in spec must be given between data read_data read from a core block and a load signal loadRDpipe_b for loading the read data to an output pad.

FIG. 3 shows a load signal generating circuit for reading data in a prior packet command driving type memory device. Referring to FIG. 3, a prior load signal generating circuit for reading data comprises a first inverting gate 21 for inverting a test load signal testLoadRDoioe_b, a first NAND GATE 22 for inputting an output signal of the first inverting gate 21 and a DA test mode signal DAMODE, a first flip flop 23 for receiving an input signal cxff3 and being synchronized to a clock signal tclk and generating cas_in_ff4, a second NAND GATE 24 for receiving the output cas_in_ff4 of the first flip flop 23 and a signal tdac_en<3>, a first OR GATE 25 for receiving an output signal ldat_dac3_b of the second NAND GATE 24 and an inverted signal of ldat_dac4_b, a buffer 26 for buffering an output of the first flip flop 23, a second flip flop 27 for receiving an output signal cxff4 of the buffer 26 and being synchronized to a clock signal rclk and generating a signal cas_out_ff4 as an output signal, a second inverting gate 28 for inverting a DA test mode signal DAMODE, a third NAND GATE 29 for receiving an output signal of the second inverting gate 28 and an output signal of the second flip flop 27 cas_out_ff4 and tdac_en<4>, a third flip flop 31 for receiving an output signal cas_out_ff4 of the second flip flop 27 and generating an output signal x1b by that the clock signal rclk is outputted as an enable signal ENB, a fourth flip flop 32 for receiving an output signal ldat_dac4_b of the third NAND GATE 29 and being synchronized to the clock signal rclk and generating an output signal x2b, a first AND GATE 33 for receiving the output signal x1b and an inverted signal of the output signal x2b of the fourth flip flop 32, a second OR GATE 34 for receiving an inverted output signal of the first NAND GATE 22 and an output signal of the first AND GATE 33, a fifth flip flop 35 for receiving an output signal of the second OR GATE 34 as an input signal DA data, an output signal of the first OR GATE 25 as an input signal, an output signal of the second NOR GATE 30 as an enable signal DAB, and generating a load signal LDRDpipe by being synchronized to the clock signal tclk, a third inverting gate 36 for inverting an output of the fifth flip flop 35 and generating an inverted load signal loadRDpipe_b.

An operation of a load signal generating circuit of the above-mentioned prior memory device is explained with reference to a waveform of FIG. 7 as the following.

The fifth flip flop 35 is synchronized to the clock signal rclk and latches a signal being inputted to an input terminal D in a case that an enable signal DAB is high state, latches a signal of an input terminal Dadata regardless of the clock signal rclk, generates a load signal LDRDpipe as its output signal in a case that an enable signal DAB is in a low state.

In a case of tdac_3<3>=1, a first flip flop 23 receives a signal cxff3 in an ascending edge of the clock signal rclk and generates a signal cas_in_ff4 delayed by 1 clock, the output signal cas_in_ff4 of the first flip flop 23 is inputted to an input D of the fifth flip flop 35 through logic gates 24, 25. Therefore, the fifth flip flop 35 outputs an output signal LDRDpipe accurately in a next ascending edge of the clock signal rclk, an output signal of the fifth flip flop 35 is inverted via an inverting gate 36 and generates a signal loadRDpipe.

On one hand, in a case of tdac_en<4>=1, a first flip flop 23 receives a signal cxff3 in an ascending edge of the clock signal rclk and generates a signal cas_in_ff4 delayed by 1 clock, a second flip flop 27 receives an output signal cas_in_ff4 via a buffer 26, generates a signal delayed by 1 clock, i.e., a signal cas_out_ff4 delayed by 2 clocks than cxff3 in an ascending edge of a next clock signal rclk.

An output signal cas_out_ff4 of the second flip flop 27 is inputted to an input D of a third flip flop 30, synchronized in an ascending edge of the clock signal rclk, outputs an output signal x2b via its output stage Q.

Output signals x1b, x2b of the third and the fourth flip flop 31, 32 are inputted to a fourth NAND GATE 33 and a third NOR GATE 34, generate a signal rdpipe with ½ cycle to a fifth flip flop 35. At this time, as the output signals x1b, x2b of the third and the fourth flip flop 31, 32 are inputted to a logic gate 33, 34 and generates a signal rdpipe, the signal rdpipe has a width of ½ cycle and a delay simultaneously.

The signal rdpipe being generated via the third NOR GATE 34 is inputted to an input Dadata of the fifth flip flop 35, the fifth flip flop 35 latches the signal Dadata and delays it regardless of a clock signal rclk and generates a signal loadRDpipe as an output signal. A signal loadRDpipe generated from a fifth flip flop 35 is inverted via an inverter 36 and generates a signal loadRDpipe_b.

FIG. 4 shows a fifth flip flop 35 in detail. Referring to FIG. 4, a transfer gate 361 is turned on by a data enable signal DAB in a DA mode, outputs a signal rdpipe being inputted to an input stage Dadata as a load signal LdRdpipe immediately. When it is a normal operation, the transfer gate 361 generates control signals (sck, sckb), (mck, mckb) of transfer gates 355, 358 via logic gates 351–354 by using a clock signal rclk being inputted to a clock terminal, drives the transfer gates 355, 358 by way of the control signals (sck, cskb), (mck, mckb), generates a signal rdpipeEn_dly being inputted to an input stage D via the transfer gates 355, 358 as a load signal LdRdpipe.

A prior load signal generating circuit mentioned above generated a signal rdpipe being inputted to an input Dadata of a flip flop regardless of a clock signal in a case of tdac_en<4>, a great delay was generated because a signal cas_out_ff4 is delayed via two logic gates and generates a signal rdpipe.

Accordingly, a signal loadRDpipe having ½ cycle in tdac_en<4 is generated, but a sufficient time can't be secured because of a great delay. That is, there was a problem that a signal loadRDpipe has ½ cycle, but the signal is delayed to the right as a whole via a logic gate as FIG. 7, a data hold time doesn't satisfy 2.5 ns specified in a spec as depicted FIG. 2C.

SUMMARY OF THE INVENTION

The present invention is invented to solve the above mentioned problem of the prior art, it is an object of this invention to provide a load signal generating circuit of a packet command driving type memory device for generating a load signal having ½ cycle synchronized to a clock signal and a sufficient data retain time.

It is another object of this invention to provide a load signal generating circuit of a packet command driving type memory device having a simple composition of a circuit and a small chip size.

To accomplish the object of this invention, in a packet command driving type memory device for generating a load signal for loading data from a core block, a load signal generating circuit of a packet command driving type memory device of this invention comprises a first signal generating means for receiving a first input signal and generating a first internal signal; a second signal generating means for receiving a second input signal and generating a second internal signal in response to a clock signal; a third signal generating means for receiving a third input signal and generating a third internal signal; a fourth signal generating means for receiving the first internal signal generated from the first signal generating means, the second internal signal generated from the second signal generating means as two inputs, selecting and outputting the first internal signal or selecting the second internal signal and generating a load signal synchronized to a clock signal according to the third input signal generated from the third signal generating means.

The first signal generating means has an inverter for receiving the first input signal and inverting it and generating the first internal signal, the third signal generating means has an inverter for receiving the third input signal and inverting it and generating the third internal signal.

The second signal generating means comprises a first flip flop for being synchronized to an ascending edge of the clock signal and delaying the second input signal by 1 cycle and outputting an output signal; a first NAND GATE for receiving an output signal of the first flip flop and a fourth input signal and combining them logically; a second flip flop for latching an output signal of the first flip flop by a low level enable of the clock signal; a buffer means for buffering an output signal of the first flip flop; a third flip flop for being synchronized to an ascending edge of the clock signal and generating an output signal that an output signal of the buffer means is delayed by 1 cycle; a second NAND GATE for receiving output signals of the second and the third flip flop and a fifth input signal; an OR GATE for receiving an inverted output signals of the first and the second NAND GATE and generating the second internal signal.

The fourth signal generating means comprises a fourth flip flop for receiving the first internal signal generated from the first signal generating means as the first input signal and the second internal signal generated from the second signal generating means as the second input signal, receiving the third internal signal generated from the third signal generating means as an enable signal, selecting and generating the first input signal as a load signal in a case that the enable signal is in a low state, the second input signal as a load signal in a case that the enable signal is in a high state.

The fourth flip flop comprises a first transfer means for transferring the second input signal according to the first control signal and the second control signal or transferring the second input signal according to the third control signal and the fourth control signal; a second transfer means for transferring the first input signal according to the fifth control signal; an output means for latching and outputting the transferred signal via the first and the second transfer means; a first control signal generating means for generating the fifth control signal; a second control signal generating means for generating the first control signal and the second control signal; a third control signal generating means for generating the third control signal and the fourth control signal.

The first transfer means comprises a first transfer gate for transferring the second input signal according to the first control signal; a first latch means for latching the second input signal passed through the first transfer gate; a second transfer gate for transferring the second input signal latched through the first latch means according to the second control signal.

The first transfer means comprises a third transfer gate for transferring the second input signal according to the third control signal; a second latch means for latching a signal passed through the third transfer gate; a fourth transfer gate for transferring the second input signal passed through the second latch means according to the fourth control signal.

The second transfer means comprises a first inverter for inverting the first input signal; a fifth transfer gate for transferring the first input signal inverted through the first inverter according to the fifth control signal.

The output means comprises a third latch means for latching a signal passed through the second transfer gate of the first transfer means or a signal passed through the fourth transfer gate or latching a signal passed through the fifth transfer gate of the second transfer means; a second inverter for inverting a signal latched via the third latch means and outputting it as a load signal which is an output signal.

The first control signal generating means comprises a third inverter for receiving and inverting the enable signal and generating it as a fifth control signal.

The second control signal generating means comprises a first NAND GATE for combining the enable signal and a clock signal via a NAND GATE logically and outputting a fourth inverted control signal; a fourth inverting gate for inverting an output of the NAND GATE and outputting a fourth control signal; a fifth inverting gate for inverting an output of the fourth inverting gate and outputting a third inverted control signal; a sixth inverting gate for inverting an output of the fifth inverting gate and outputting a third control signal.

The third control signal generating means comprises a second NAND GATE for receiving the enable signal and the fourth input signal and combining them via a NAND GATE logically; a first NOR GATE for receiving an output of the second NAND GATE and the clock signal as two inputs and combining them via a NOR GATE logically and outputting a second inverted control signal; a seventh inverting gate for inverting an output of the first NOR GATE and outputting a second inverted signal; an eighth inverting gate for inverting an output signal of the seventh inverting gate and output ting a first inverted control signal; a ninth inverting gate for inverting an output signal of the eighth inverting gate and outputting a first control signal.

DETAILED DESCRIPTION OF THE INVENTION

Hereinafter, a preferred embodiment of this invention will be explained in more detail with reference to the accompanying drawings.

Figure 1:
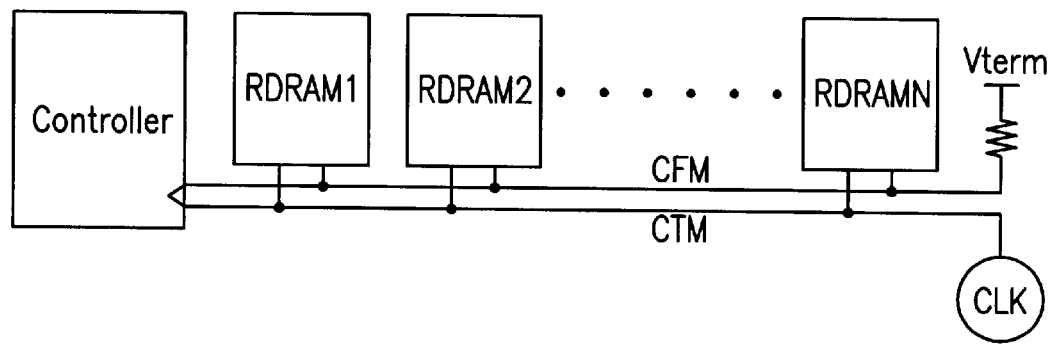
FIG. 1 indicates a channel structure in a general packet command driving type memory device.
Figure 2A:
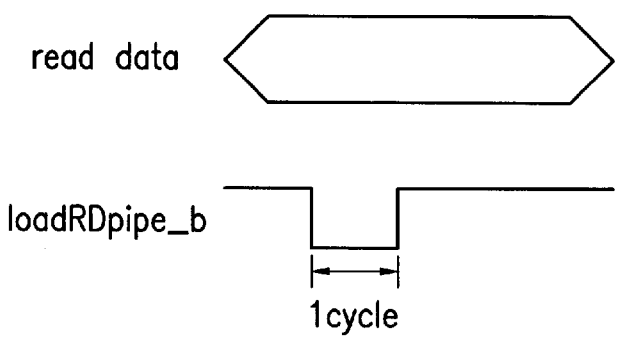
FIGS. 2A–2C shows a waveform for explaining a relation between read data and a load signal in a prior packet command driving type memory device.
Figure 2B:
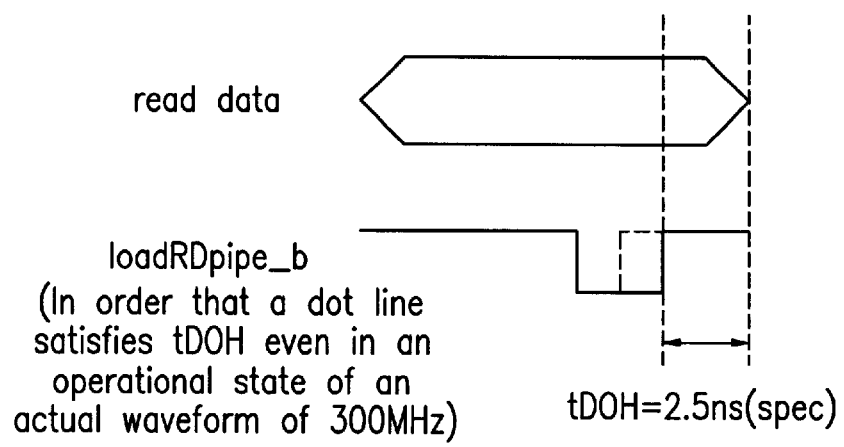
Figure 2C:
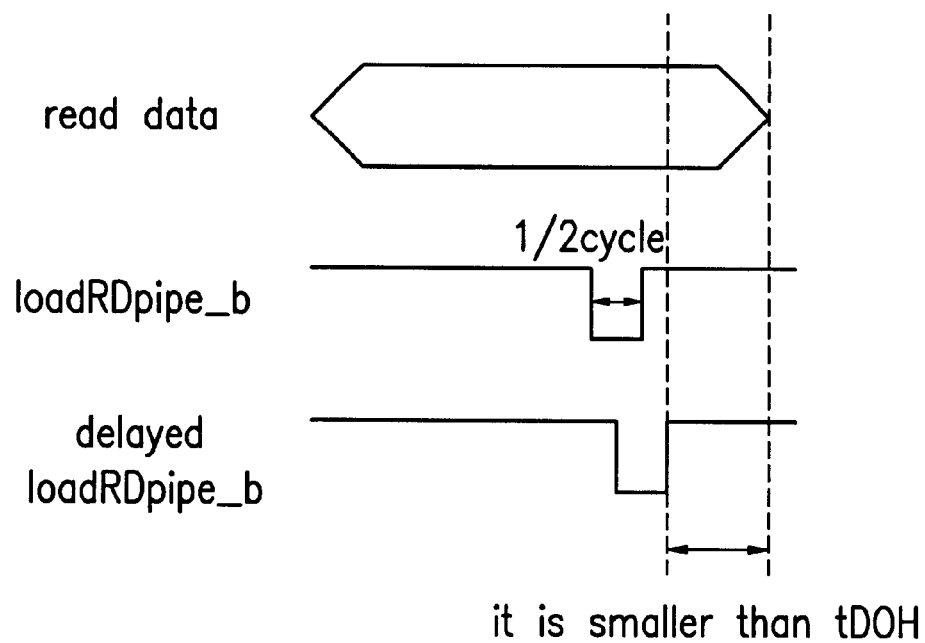
Figure 3:
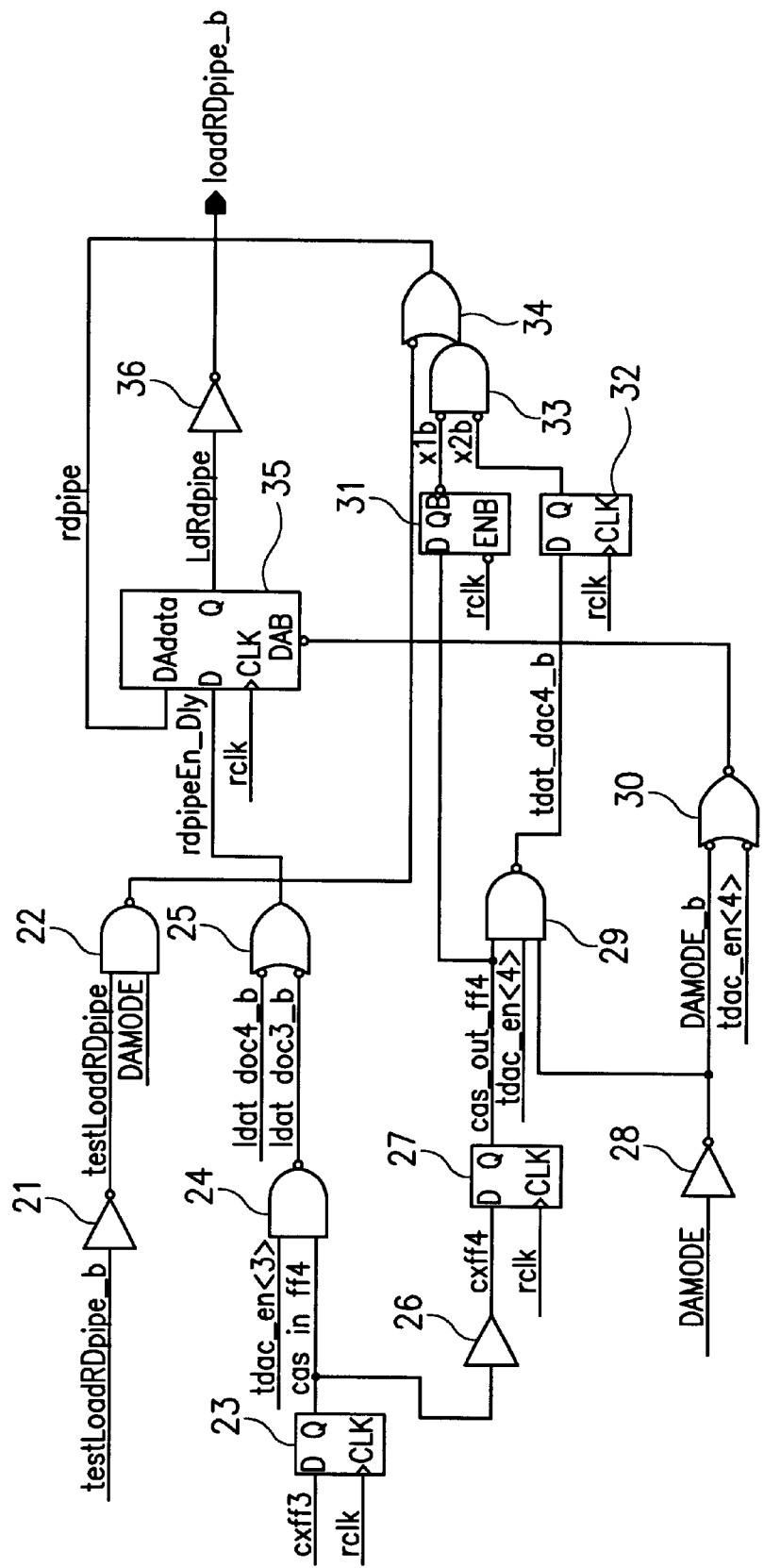
FIG. 3 shows a load signal gene rating circuit for reading data in a prior packet command driving type memory device.
Figure 4:
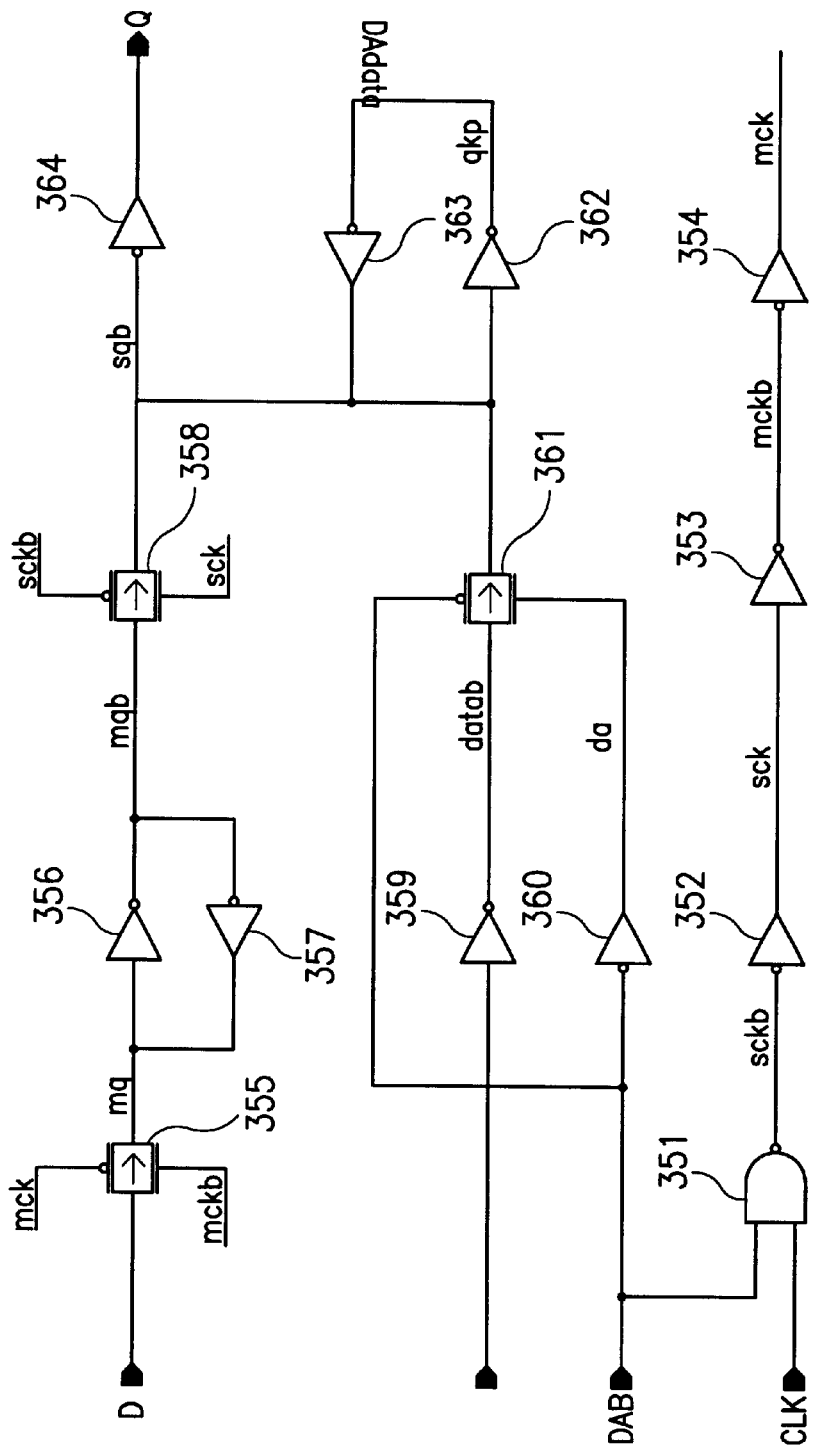
FIG. 4 shows a flip flop in a load signal generating circuit of FIG. 3 in detail.
Figure 5:
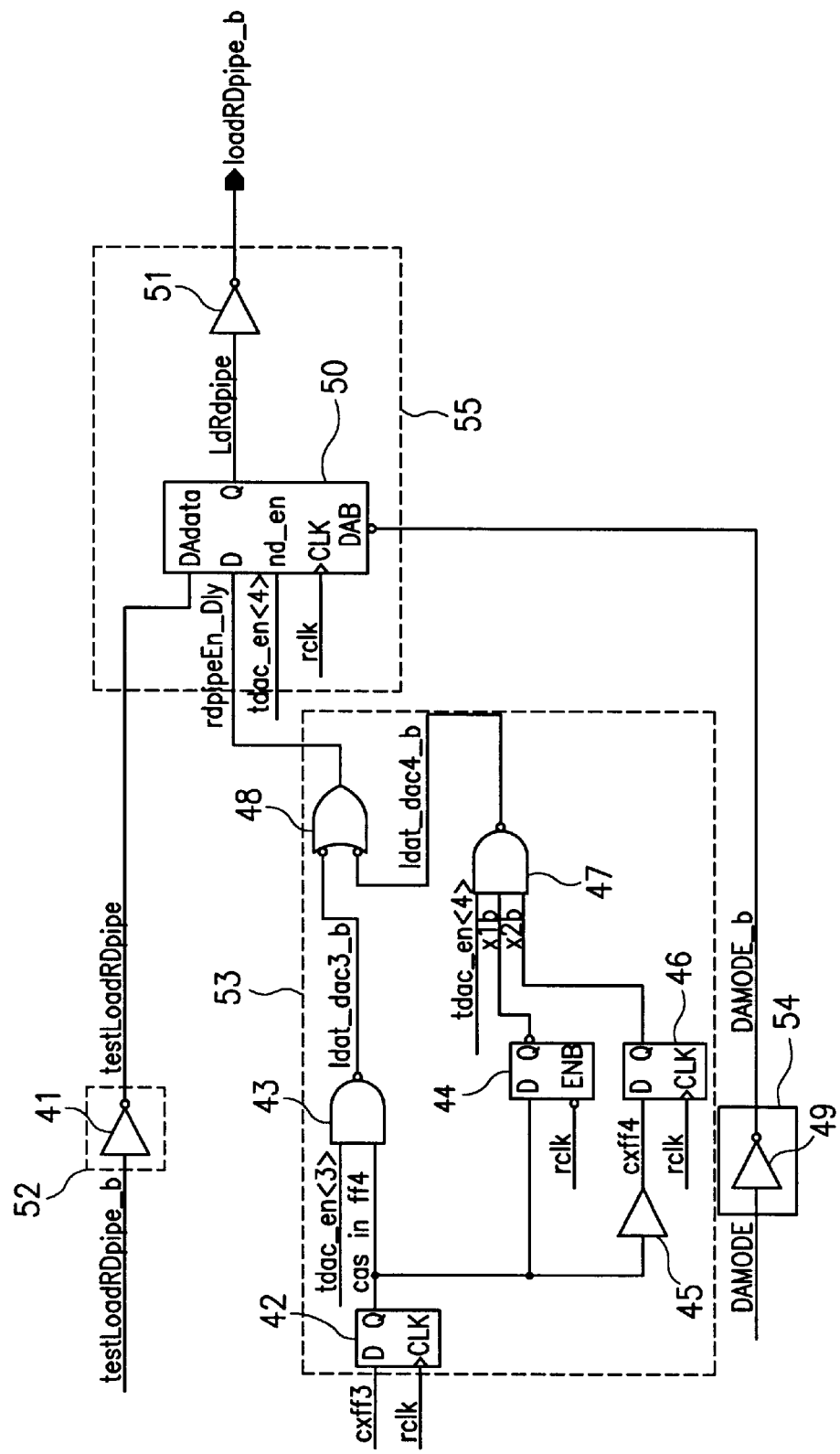
FIG. 5 shows a load signal generating circuit in a packet command driving type memory device according to an embodiment of this invention.

FIG. 5 shows a load signal generating circuit in a packet command driving type memory device according to an embodiment of this invention. Referring to FIG. 5, a load signal generating circuit of a packet command driving type memory device of this invention comprises a first signal generating means 52 for receiving a first input signal testLoadRDpipe_b and generating a first internal signal testLoadRDpipe; a second signal generating means 53 for receiving a second input signal cxff3 and generating a second internal signal rdpipeEn_dly in response to a clock signal rclk; a third signal generating means 54 for receiving a test mode signal DAMODE and generating a third internal signal DAMODE_b; a fourth signal generating means 55 for receiving the first internal signal testLoadRDpipe generated from the first signal generating means 52 and the second internal signal rdpipeEn_dly generated from the second signal generating means 53 as two inputs, selecting and outputting the first internal signal or selecting the second internal signal and generating a load signal loadRDpipe_b synchronized to a clock signal according to the third input signal DAMODE_b generated from the third signal generating means 54.

The first signal generating means 52 has a first inverter 41 for receiving the first input signal testLoadRDpipe_b and inverting it and generating the first internal signal testLoadRDpipe, the third signal generating means 54 has a second inverter 49 for receiving the test mode signal DAMODE and inverting it and generating the third internal signal DAMODE_b.

The second signal generating means 53 comprises a first flip flop 42 for being synchronized to an ascending edge of the clock signal rclk and delaying the second input signal cxff3 by 1 cycle and outputting an output signal cas_in_ff4; a first NAND GATE 43 for receiving an output signal cas_in_ff4 of the first flip flop 42 and a fourth input signal tdac_en<3> and combining them logically, generating a signal ldat_dac_b; a second flip flop 44 for latching an output signal cas_in_ff4 of the first flip flop 42 by a low level enable of the clock signal rclk and generating a signal x1b; a buffer means 45 for buffering an output signal of the first flip flop 42; a third flip flop 46 for being synchronized to an ascending edge of the clock signal rclk and receiving an output of the buffer means and generating an output signal x2b; a second NAND GATE 47 for receiving output signals x1b, x2b of the second and the third flip flop 44, 46 and a fifth input signal tdac_en<4> and combining them, generating a signal ldat_dac4_b<4>; an OR GATE 48 for receiving an inverted output signals of the first and the second NAND GATE 43, 47 and generating the second internal signal rdpipeEn_dly.

The fourth signal generating means 55 comprises a fourth flip flop 50 for receiving the first internal signal testLoadRDpipe generated from the first signal generating means 52 as the first input signal DAdata and the second internal signal rdpipeEn_dly generated from the second signal generating means 53 as the second input signal, using the input signal tdac_en<4> as an input signal nd_en, receiving the third internal signal DAMODE_b generated from the third signal generating means 54 as an enable signal DAB, selecting and generating the first input signal DAdata as a load signal LdRdpipe in a case that the enable signal DAB is in a low state, in a case that the enable signal is in a high state, when the input signal nd_en is low again, synchronizing an input signal D only to an ascending edge of the clock signal rclk and outputting it, when the input signal nd_en is high, synchronizing an input signal D both to an ascending edge and a descending edge of the clock signal rclk and outputting it, a third inverter 51 for inverting the load signal LdRdpipe generated from the fourth flip flop 50 and generating an inverted load signal LdRdpipe.

Figure 6:
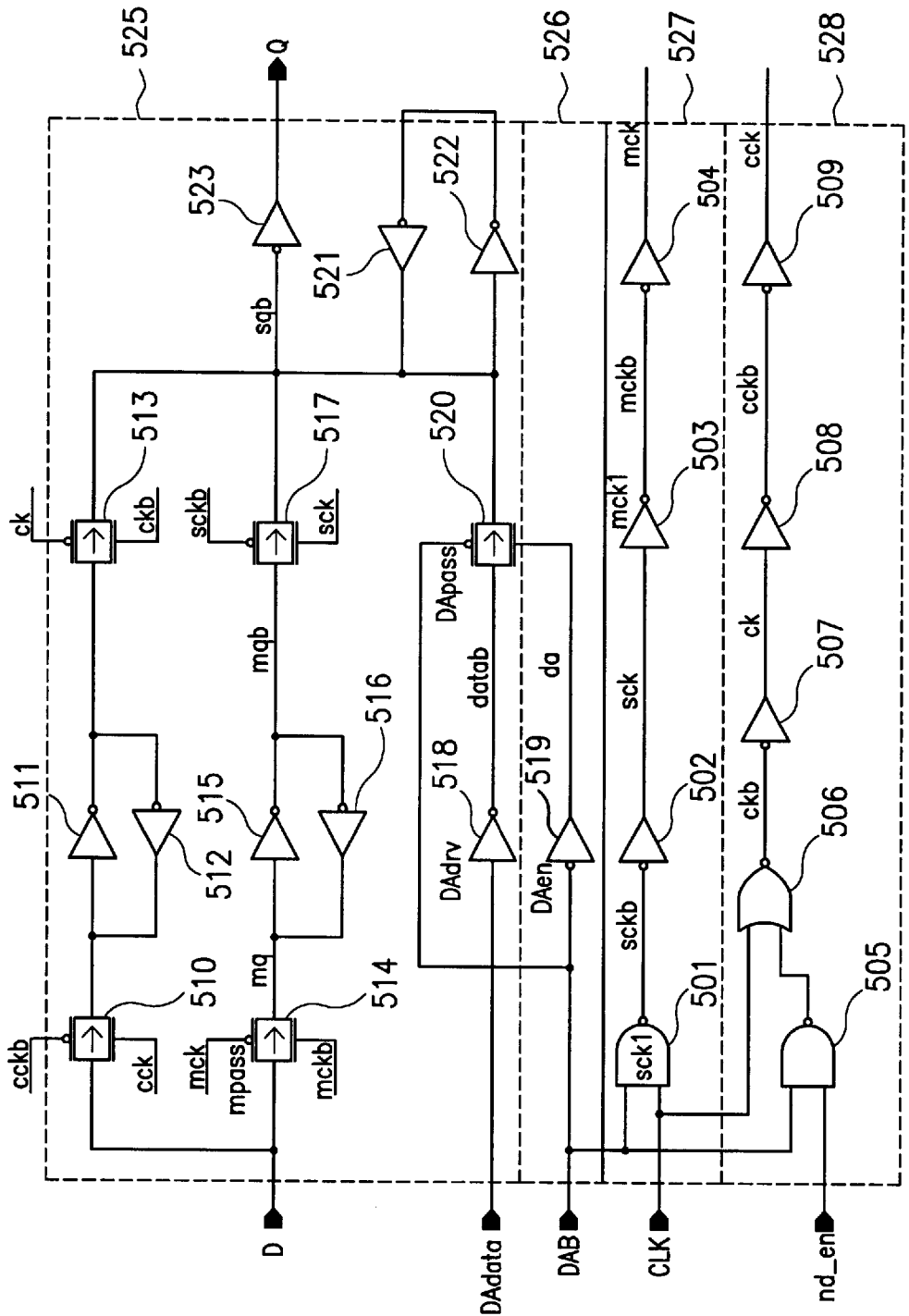
FIG. 6 shows a flip flop in a load signal generating circuit of FIG. 5 in detail.
Figure 7:
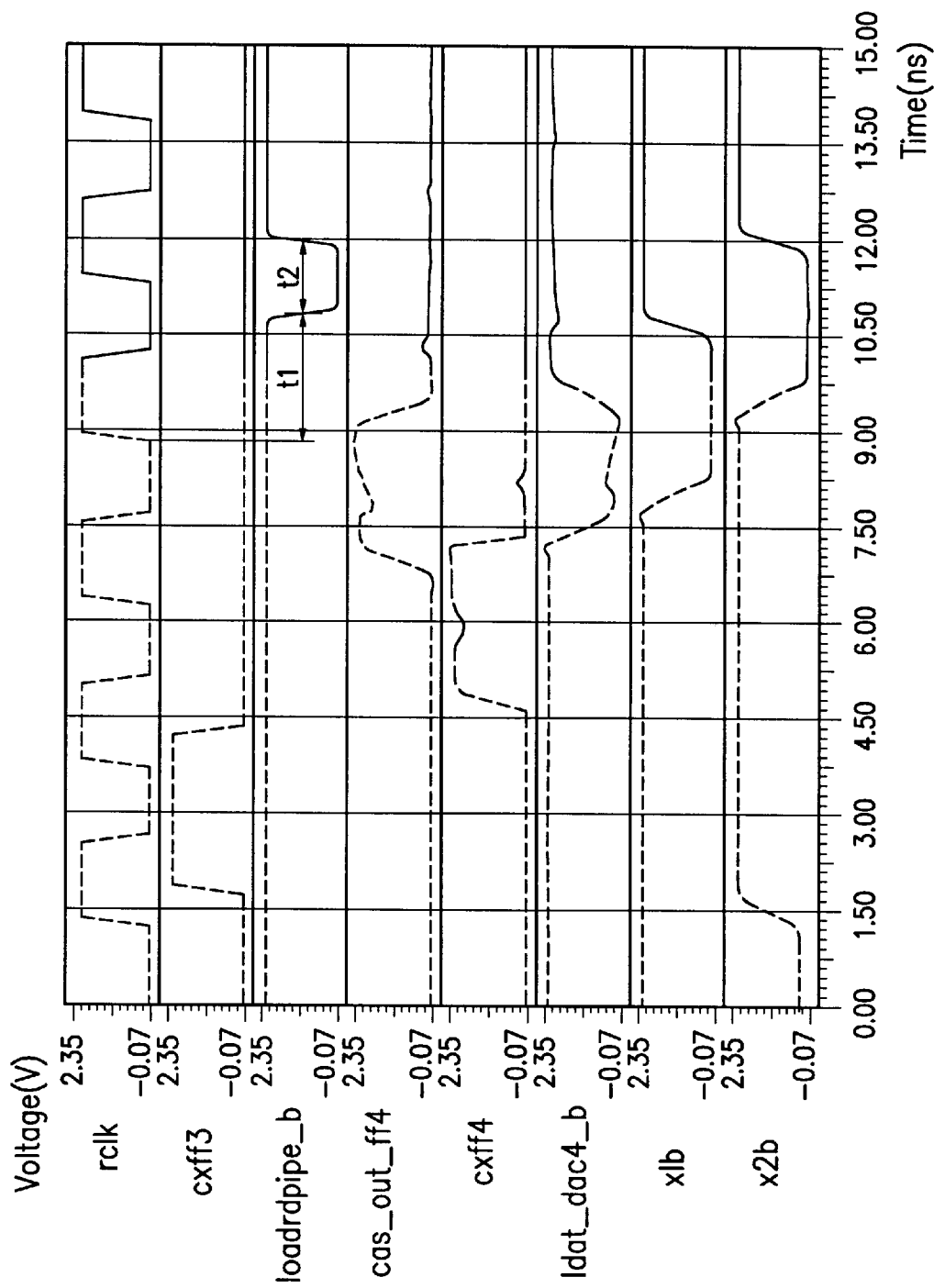
FIG. 7 shows an operational waveform of a load signal generating circuit of a prior packet command driving type memory device.

FIG. 6 shows a fourth flip flop in a load signal generating circuit of FIG. 5 in detail. Referring to FIG. 6, the fourth flip flop 50 comprises a first transfer means for transferring the second input signal D according to the first control signal cck, cckb and the second control signal ck, ckb or transferring the second input signal D according to the third control signal mck, mckb and the fourth control signal sck, sckb, a second transfer means for transferring the first input signal DAdata according to the fifth control signal da and a signal DAB, an output means for latching and outputting the signal transferred via the first and the second transfer means.

The first transfer means comprises a first transfer gate 510 for transferring the second input signal D according to the first control signal cck, cckb; a first latch means having a pair of inverters 511, 512 for latching the second input signal passed through the first transfer gate 510; a second transfer gate for transferring the second input signal latched through the first latch means according to the second control signal ck, ckb.

The first transfer means comprises a third transfer gate 514 for transferring the second input signal D according to the third control signal mck, mckb; a second latch means having a pair of inverters 515, 516 for latching a signal passed through the third transfer gate 514; a fourth transfer gate 517 for transferring the second input signal passed through the second latch means according to the fourth control signal sck, sckb.

The second transfer means comprises a first inverter 518 for inverting the first input signal DAdata; a fifth transfer gate 520 for transferring the first input signal DAdata inverted through the first inverter 518 according to the fifth control signal da and a signal DAB.

The output means comprises a third latch means having a pair of inverters 521, 522 for latching a signal passed through the second transfer gate 513 of the first transfer means or a signal passed through the fourth transfer gate 517, a second inverter 523 for inverting a signal latched via the third latch means and outputting it as a load signal LdRdpipe which is an output signal.

The fourth flip flop 50 further comprises a first control signal generating means 526 for generating the fifth control signal da, a second control signal generating means 527 for generating the first control signal cck, cckb and the second control signal sck, sckb, a third control signal generating means 528 for generating the third control signal mck, mckb and the fourth control signal cck, cckb.

The first control signal generating means 526 comprises a third inverter 519 for receiving and inverting the enable signal DAB and generating it as a fifth control signal da.

The second control signal generating means 527 comprises a first NAND GATE 501 for combining the enable signal DAB and a clock signal CLK via a NAND GATE logically and outputting a fourth inverted control signal sckb, a fourth inverting gate 502 for inverting an output of the first NAND GATE 501 and outputting a fourth control signal sck; a fifth inverting gate 503 for inverting an output of the fourth inverting gate 502 and outputting a third inverted control signal mckb, a sixth inverting gate 504 for inverting an output of the fifth inverting gate 503 and outputting a third control signal mck.

The third control signal generating means 528 comprises a second NAND GATE 505 for receiving the enable signal DAB and the fourth input signal nd_en and combining them via a NAND GATE logically, a first NOR GATE 506 for receiving an output of the second NAND GATE 505 and the clock signal CLK as two inputs and combining them via a NOR GATE logically and outputting a second inverted control signal ckb, a seventh inverting gate 507 for inverting an output of the first NOR GATE 506 and outputting a second inverted signal ck, an eighth inverting gate 508 for inverting an output signal of the seventh inverting gate 507 and outputting a first inverted control signal cckb, a ninth inverting gate 509 for inverting an output signal of the eighth inverting gate 508 and outputting a first control signal cck.

Figure 8:
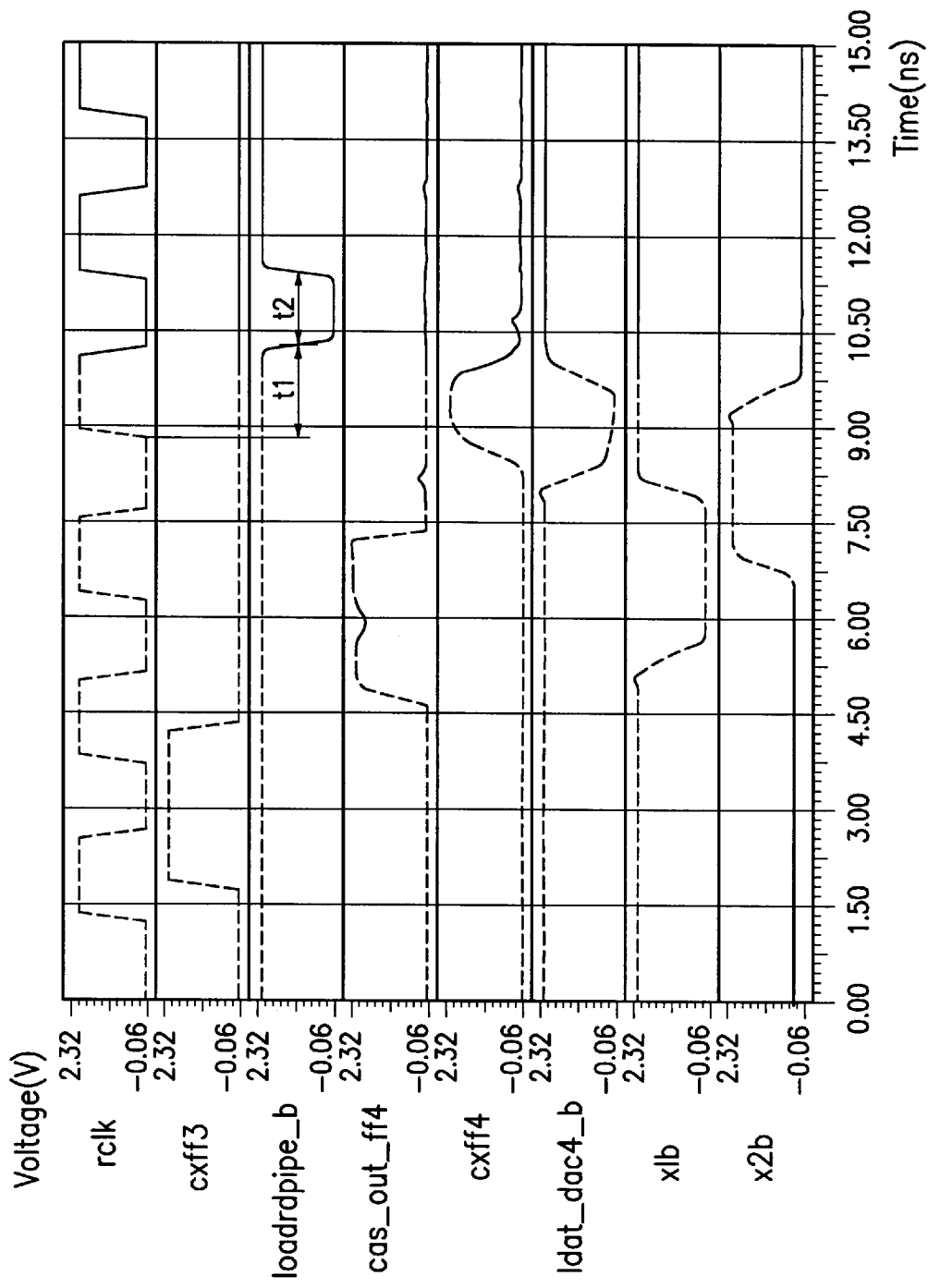
FIG. 8 shows an operational waveform of a load signal generating circuit of a packet command driving type memory device according to an embodiment of this invention.

An operation of a load signal generating circuit of this invention having the above-mentioned composition will be explained in more detail with reference to FIG. 8 as the following.

In the case that an enable signal DAB is in a high state, when a signal nd_en is low again, the fifth flip flop 35 synchronizes an input terminal D only to an ascending edge of the clock signal rclk, when a signal nd_en is high, synchronizes an input terminal D both to an ascending edge and a descending edge of the clock signal rclk, latches it, in the case that an enable signal DAB is in a low state, the fifth flip flop 35 latches an input signal DAdata regardless of a clock signal rclk, generates a load signal LDRDpipe as its output signal.

In a case of tdac_3<3>=1, a first flip flop 42 receives a signal cxff3 in an ascending edge of a clock signal rclk, generates a signal cas_in_ff4 delayed by 1 clock, an output signal of the first flip flop 23 is inputted to an input of the fourth flip flop 50 via logic gates 43, 48. Accordingly, the fourth flip flop 50 outputs an output signal LDRDpipe exactly in a next ascending edge of a clock signal rclk, an output signal of the fourth flip flop 50 is inverted through an inverting gate 51 and generates a signal loadRDpipe.

On one hand, in a case of tdac_en<4>=1, a first flip flop 42 receives a signal cxff3 in an ascending edge of a clock signal rclk, generates a signal cas_in_ff4 delayed by 1 clock, a second flip flop 44 receives an output signal cas_in_ff4 of the first flip flop 42 through a buffer 45, and then generates a signal delayed by 1 clock in an ascending edge of a clock signal rclk, i.e., a signal x2b delayed by 2 clocks than a signal cxff3.

Also, the output signal cas_in_ff4 of the first flip flop 42 is inputted to an input D of the second flip flop 44, enabled in a descending edge of a clock signal rclk, outputs an output signal x1b via its inverted output stage QB.

And, output signals x1b, x2b of the second and the third flip flop 44, 46 and a signal tdac_en<4> are inputted to a second NAND GATE 47, generates a signal ldat_dac4_b, and then a signal rdpipeEn_Dly to an input D of the fourth flip flop 50.

As described above, when tdac_en<4>=1, a load signal generating circuit of this invention outputs the output signals x1b, x2b through the second and the third flip flop 44, 46, generates a signal ldat_dac4_b with a width of ½ cycle via a NAND GATE 47, this generates a signal ldpipeEn_dly. As the fourth flip flop 50 transfers a signal ldpipeEn_dly with a width of ½ cycle in an ascending edge and a descending edge of a clock signal rclk, it generates a signal LdRdpipe with a width of ½ cycle exactly without a delay as drawn in FIG. 8.

At this time, the fourth flip flop 50 operates only in an ascending edge of a clock signal rclk in a case of tdac_en<3>=1, operates both in an ascending edge and a descending edge of a clock signal rclk in a case of tdac_en<4>=1.

That is, a load signal generating circuit of this invention doesn't generate a signal ldat_dac4_b with ½ cycle by delaying a signal cas_in_ff4 by 1 cycle through a flip flop 27 as the prior art, generates a signal ldat_dac4_b with ½ cycle by delaying a signal cas_in_ff4 through a flip flop 44.

Referring to FIG. 6, as a signal tdac_en<4> is inputted to one input of a logic gate 505 of a third control signal generating means 528, and control signals (ck, ckb), (cck, cckb) are generated via the third control signal generating means 528 in a case of tdac_en<4>=1, and transfer gates 510, 513 of a first transfer means receiving a signal rdpipeEn_dly in a descending edge of a clock signal and generating a load signal LdRdpipe are drived, the fourth flip flop 50 operates even in a descending edge of a clock signal, generates a load signal LdRdpipe with ½ cycle synchronized to a clock signal exactly.

On one hand, in a case of tdac_en<3>=1, a third control signal generating means 528 doesn't operate.

As the third control signal generating means 528 drives transfer gates 514, 517 of a first transfer means in an ascending edge of a clock signal, generates the control signals (ck, ckb), (cck, cckb) both in a case of tdac_en<3>=1 and a case of tdac_en<4>=1.

And, in a case of DA test mode, the third control signal generating means 528 receives a signal testloadRdpipe being inputted to a terminal DAdata by a first control signal da being generated by a first control signal generating means 526, generates a load signal.

As described in more detail above, this invention enables a flip flop to operate both in an ascending edge and a descending edge of a clock signal, to be synchronized to a clock signal exactly by using a signal with a width of ½ cycle generated in its foregoing stage, to generate a load signal with a width of ½ cycle. Accordingly, a load signal maintaining an expected data hold time irrelevant to a circumferential situation can be generated.

Also, a load signal generating circuit of the present invention has an advantage that a chip size can be reduced due to its compact composition compared to a prior circuit. The present invention can be realized variously in a changed form within the scope that doesn't depart from the point of this invention.

What is claimed is:

1. In a packet command driving type memory device for generating a load signal for loading data from a core block, a load signal generating circuit of a packet command driving type memory device comprising:
    a first signal generating means for receiving a first input signal and generating a first internal signal;
    a second signal generating means for receiving a second input signal and generating a second internal signal in response to a clock signal;
    a third signal generating means for receiving a third input signal and generating a third internal signal;
    a fourth signal generating means for receiving the first internal signal generated from the first signal generating means and the second internal signal generated from the second signal generating means as two inputs, selecting and outputting the first internal signal or selecting the second internal signal and generating a load signal synchronized to a clock signal according to the third input signal generated from the third signal generating means.

2. The load signal generating circuit of a packet command driving type memory device as claimed in claim 1, wherein the first signal generating means has an inverter for receiving the first input signal and inverting it and generating the first internal signal.

3. The load signal generating circuit of a packet command driving type memory device as claimed in claim 1, wherein the third signal generating means has an inverter for receiving the third input signal and inverting it and generating the third internal signal.

4. The load signal generating circuit of a packet command driving type memory device as claimed in claim 1, wherein the second signal generating means comprises:
    a first flip flop for being synchronized to an ascending edge of the clock signal and delaying the second input signal by 1 cycle and outputting an output signal;
    a first NAND GATE for receiving an output signal of the first flip flop and a fourth input signal and combining them logically;
    a second flip flop for being enabled by a descending edge of the clock signal and latching an output signal of the first flip flop;
    a buffer means for buffering an output signal of the first flip flop;
    a third flip flop for being synchronized to an ascending edge of the clock signal and generating an output signal that an output signal of the buffer means is delayed by 1 cycle;
    a second NAND GATE for receiving output signals of the second and the third flip flop and a fourth input signal;
    an OR GATE for receiving an inverted output signals of the first and the second NAND GATE and generating the second internal signal.

5. The load signal generating circuit of a packet command driving type memory device as claimed in claim 1, wherein the fourth signal generating means comprises:
    a fourth flip flop for receiving the first internal signal generated from the first signal generating means as the first input signal and the second internal signal generated from the second signal generating means as the second input signal, receiving the third internal signal generated from the third signal generating means as an enable signal, selecting and generating the first input signal as a load signal in a case that the enable signal is in a low state, selecting the second input signal and synchronizing it to an ascending edge and a descending edge of a clock signal or only to an ascending edge of the clock signal, generating a load signal in a case that the enable signal is in a high state.

6. The load signal generating circuit of a packet command driving type memory device as claimed in claim 5, wherein the fourth flip flop comprises:
    a first transfer means for transferring the second input signal according to the first control signal and the second control signal or transferring the second input signal according to the third control signal and the fourth control signal;
    a second transfer means for transferring the first input signal according to the fifth control signal;
    an output means for latching and outputting the transferred signal via the first and the second transfer means;
    a first control signal generating means for generating the fifth control signal;
    a second control signal generating means for generating the first control signal and the second control signal;
    a third control signal generating means for generating the third control signal and the fourth control signal.

7. The load signal generating circuit of a packet command driving type memory device as claimed in claim 6, wherein the first transfer means comprises:
    a first transfer gate for transferring the second input signal according to the first control signal;
    a first latch means for latching the second input signal passed through the first transfer gate;
    a second transfer gate for transferring the second input signal latched through the first latch means according to the second control signal.

8. The load signal generating circuit of a packet command driving type memory device as claimed in claim 6, wherein the first transfer means comprises:
    a third transfer gate for transferring the second input signal according to the third control signal;
    a second latch means for latching a signal passed through the third transfer gate;

a fourth transfer gate for transferring the second input signal passed through the second latch means according to the fourth control signal.

9. The load signal generating circuit of a packet command driving type memory device as claimed in claim 6, wherein the second transfer means comprises a first inverter for inverting the first input signal;

a fifth transfer gate for transferring the first input signal inverted through the first inverter according to the fifth control signal.

10. The load signal generating circuit of a packet command driving type memory device as claimed in claim 6, wherein the output means comprises:

a third latch means for latching a signal passed through the second transfer gate of the first transfer means or a signal passed through the fourth transfer gate and a signal passed through the fifth transfer;

a second inverter for inverting a signal latched via the third latch means and outputting it as a load signal which is an output signal.

11. The load signal generating circuit of a packet command driving type memory device as claimed in claim 6, wherein the first control signal generating means comprises a third inverter for receiving and inverting the enable signal and generating it as a fifth control signal.

12. The load signal generating circuit of a packet command driving type memory device as claimed in claim 6, wherein the second control signal generating means comprises:

a first NAND GATE for combining the enable signal and a clock signal via a NAND GATE logically and outputting a fourth inverted control signal;

a fourth inverting gate for inverting an output of the NAND GATE and outputting a fourth control signal;

a fifth inverting gate for inverting an output of the fourth inverting gate and outputting a third inverted control signal;

a sixth inverting gate for inverting an output of the fifth inverting gate and outputting a third control signal.

13. The load signal generating circuit of a packet command driving type memory device as claimed in claim 6, wherein the third control signal generating means comprises:

a second NAND GATE for receiving the enable signal and the fourth input signal and combining them via a NAND GATE logically;

a first NOR GATE for receiving an output of the second NAND GATE and the clock signal as two inputs and combining them via a NOR GATE logically and outputting a second inverted control signal;

a seventh inverting gate for inverting an output of the first NOR GATE and outputting a second control signal;

an eighth inverting gate for inverting an output signal of the seventh inverting gate and outputting a first inverted control signal;

a ninth inverting gate for inverting an output signal of the eighth inverting gate and outputting a first control signal.

* * * * *